(12) United States Patent
Ahn

(10) Patent No.: US 11,651,822 B2
(45) Date of Patent: May 16, 2023

(54) METHOD OF OPERATING NONVOLATILE MEMORY DEVICE, NONVOLATILE MEMORY DEVICE PERFORMING THE SAME AND METHOD OF OPERATING MEMORY SYSTEM USING THE SAME

(71) Applicant: Samsung Electronics Co., Ltd., Suwon-si (KR)

(72) Inventor: Seongho Ahn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/577,738

(22) Filed: Jan. 18, 2022

(65) Prior Publication Data
US 2022/0139459 A1    May 5, 2022

Related U.S. Application Data

(63) Continuation of application No. 16/891,463, filed on Jun. 3, 2020, now Pat. No. 11,238,932.

(30) Foreign Application Priority Data

Sep. 20, 2019    (KR) .................... 10-2019-0116003

(51) Int. Cl.
| G11C 16/04 | (2006.01) |
| G11C 16/08 | (2006.01) |
| G11C 16/26 | (2006.01) |
| G11C 16/10 | (2006.01) |

(52) U.S. Cl.
CPC .......... *G11C 16/08* (2013.01); *G11C 16/0483* (2013.01); *G11C 16/10* (2013.01); *G11C 16/26* (2013.01)

(58) Field of Classification Search
CPC ..... G11C 16/08; G11C 16/0483; G11C 16/10; G11C 16/26
See application file for complete search history.

(56) References Cited

U.S. PATENT DOCUMENTS

| 6,330,186 B2 | 12/2001 | Tanaka |
| 7,187,585 B2 | 3/2007 | Li et al. |
| 7,193,898 B2 | 3/2007 | Cernea |
| 7,257,032 B2 | 8/2007 | Fujiu et al. |

(Continued)

FOREIGN PATENT DOCUMENTS

| KR | 10-2009-0028980 A | 3/2009 |
| KR | 10-0934496 B1 | 12/2009 |
| KR | 10-0989447 B1 | 10/2010 |

*Primary Examiner* — Pho M Luu
(74) *Attorney, Agent, or Firm* — Harness, Dickey & Pierce, P.L.C.

(57) ABSTRACT

In a method of operating a nonvolatile memory device, the nonvolatile memory device includes a memory block that includes a plurality of memory cells and is connected to a plurality of wordlines. A data write command is received. Based on the data write command, a first program operation is performed on some wordlines among the plurality of wordlines connected to the memory block. At least one of the some wordlines on which the first program operation is performed is detected as a no-coupled wordline. Without the data write command, a second program operation is performed on an open wordline on which the first program operation is not performed and adjacent to the no-coupled wordline.

20 Claims, 17 Drawing Sheets

(56) References Cited

U.S. PATENT DOCUMENTS

| | | |
|---|---|---|
| 7,269,779 B2 | 9/2007 | Watanabe |
| 7,301,808 B2 | 11/2007 | Li et al. |
| 7,301,816 B2 | 11/2007 | Li et al. |
| 7,301,839 B2 | 11/2007 | Li et al. |
| 7,321,510 B2 | 1/2008 | Li et al. |
| 7,379,343 B2 | 5/2008 | Cernea |
| 7,414,886 B2 | 8/2008 | Li et al. |
| 7,535,769 B2 | 5/2009 | Cernea |
| 7,656,713 B2 | 2/2010 | Cernea |
| 7,679,133 B2 | 3/2010 | Son et al. |
| 8,199,583 B2 | 6/2012 | Kim et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,093,158 B2 | 7/2015 | Raghu et al. |
| 9,159,441 B2 | 10/2015 | Kim et al. |
| 9,741,441 B2 | 8/2017 | Kim et al. |
| 10,002,042 B2 | 6/2018 | Rod et al. |
| 10,388,381 B2 | 8/2019 | Shin et al. |
| 10,680,005 B2 | 6/2020 | Kim et al. |
| 10,712,954 B2 | 7/2020 | Kim |
| 11,069,413 B2 * | 7/2021 | Nishikawa ............. G11C 16/10 |
| 11,238,932 B2 * | 2/2022 | Ahn ....................... G11C 16/08 |
| 11,294,580 B2 * | 4/2022 | Kim .................. G11C 16/0483 |
| 2011/0233648 A1 | 9/2011 | Seol et al. |
| 2015/0162093 A1 * | 6/2015 | Oh ..................... G11C 16/3445 |
| | | 365/185.11 |

\* cited by examiner

METHOD OF OPERATING NONVOLATILE MEMORY DEVICE, NONVOLATILE MEMORY DEVICE PERFORMING THE SAME AND METHOD OF OPERATING MEMORY SYSTEM USING THE SAME

CROSS-REFERENCE TO RELATED APPLICATION

This application is a continuation of U.S. application Ser. No. 16/891,463, filed on Jun. 3, 2020, now U.S. Pat. No. 11,238,932, which claims priority under 35 USC § 119 to Korean Patent Application No. 10-2019-0116003, filed on Sep. 20, 2019 in the Korean Intellectual Property Office (KIPO), the contents of each of which are herein incorporated by reference in their entirety.

BACKGROUND

1. Technical Field

Example embodiments relate generally to semiconductor memory devices, and more particularly to methods of operating nonvolatile memory devices, nonvolatile memory devices performing the methods, and methods of operating memory systems using the methods.

2. Description of the Related Art

Semiconductor memory devices can be roughly divided into two categories depending upon whether they retain stored data when disconnected from a power supply. These categories include volatile memory devices, which lose stored data when disconnected from power, and nonvolatile memory devices, which retain stored data when disconnected from power. The volatile memory devices may perform read and write operations at a high speed, while contents stored therein may be lost at power-off. The nonvolatile memory devices may retain contents stored therein even at power-off. The nonvolatile memory devices may be used to store contents that must be retained regardless of whether they are powered. Recently, semiconductor memory devices having memory cells that are stacked in three dimensions have been researched to improve integrity of the semiconductor memory devices.

SUMMARY

At least one example embodiment of the present disclosure provides a method of operating a nonvolatile memory device capable of reducing or minimizing firmware overhead in open blocks and performance degradation.

At least one example embodiment of the present disclosure provides a nonvolatile memory device that performs the method of operating the nonvolatile memory device.

At least one example embodiment of the present disclosure provides a method of operating a memory system that uses the method of operating the nonvolatile memory device.

According to example embodiments, in a method of operating a nonvolatile memory device, the nonvolatile memory device includes a memory block that includes a plurality of memory cells and is connected to a plurality of wordlines. A data write command is received. Based on the data write command, a first program operation is performed on some wordlines among the plurality of wordlines connected to the memory block. At least one of the some wordlines on which the first program operation is performed is detected as a no-coupled wordline. Without the data write command, a second program operation is performed on an open wordline on which the first program operation is not performed and adjacent to the no-coupled wordline.

According to example embodiments, a nonvolatile memory device includes a memory block, a row decoder and a control circuit. The memory block includes a plurality of memory cells and is connected to a plurality of wordlines. The row decoder selects the plurality of memory cells included in the memory block on a wordline-by-wordline basis. The control circuit receives a data write command, performs a first program operation on some wordlines among the plurality of wordlines connected to the memory block based on the data write command, detects at least one of the some wordlines on which the first program operation is performed as a no-coupled wordline, and performs a second program operation on an open wordline on which the first program operation is not performed and adjacent to the no-coupled wordline without the data write command.

According to example embodiments, in a method of operating a memory system, the memory system includes a memory controller and a nonvolatile memory device controlled by the memory controller. The nonvolatile memory device includes a memory block that includes a plurality of memory cells and is connected to a first wordline through an N-th wordline, where N is a natural number greater than or equal to two. The memory controller transmits a data write command, a write address and target data to be written to the nonvolatile memory device. The nonvolatile memory device performs a normal program operation on memory cells connected to the first wordline through an X-th wordline among the first through N-th wordlines connected to the memory block based on the data write command, the write address and the target data, where X is a natural number greater than or equal to one and less than or equal to (N−1). The nonvolatile memory device detects the X-th wordline among the first through N-th wordlines on which the normal program operation is performed as a no-coupled wordline. The X-th wordline is a last programmed wordline. The nonvolatile memory device performs a dummy program operation on memory cells connected to an (X+1)-th wordline on which the normal program operation is not performed and adjacent to the X-th wordline without the data write command. The memory controller transmits a data read command and a read address corresponding to the write address to the nonvolatile memory device. The nonvolatile memory device performs a read operation on all of the memory cells connected to the first through X-th wordlines on which the normal program operation is performed based on the data read command, the read address and a read voltage having a same level. The nonvolatile memory device transmits the target data to the memory controller as a result of the read operation.

In the method of operating the nonvolatile memory device, the nonvolatile memory device and the method of operating the memory system according to example embodiments, when the no-coupled wordline is detected in the open block after the memory block becomes the open block by performing the first program operation (e.g., the normal program operation) on a portion of the memory block, the no-coupled wordline in the open block may be formed as (e.g., changed into) the coupled wordline in advance by performing the second program operation (e.g., the dummy program operation) without the external command. Thus, the performance degradation may not occur because the default read failure due to the no-coupled wordline does not occur, and it may not be required to consider the no-coupled wordline for all read operations. Accordingly, the complexity of firmware may be reduced, the free resources may be reserved, and the firmware overhead and the performance degradation due to the no-coupled wordline may be reduced or minimized.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EMBODIMENTS

Figure 1:
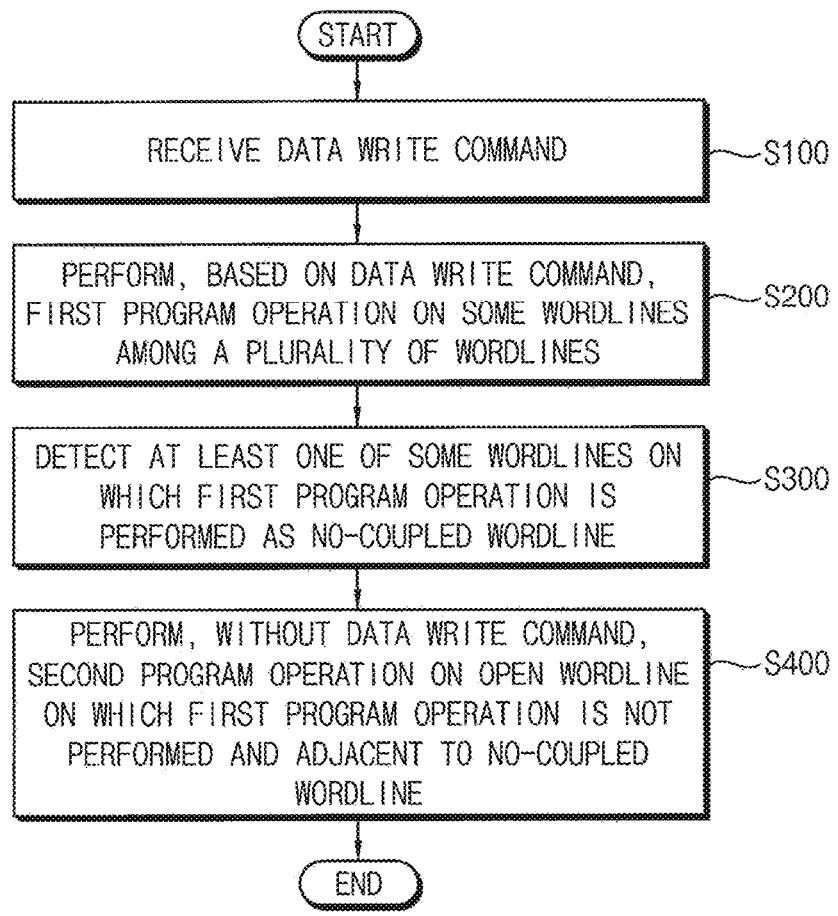
FIG. 1 is a flowchart illustrating a method of operating a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of operating a nonvolatile memory device according to example embodiments.

Referring to FIG. 1, a nonvolatile memory device according to example embodiments includes at least one memory block. The memory block includes a plurality of memory cells and is connected to a plurality of wordlines. Configurations of the nonvolatile memory device and the memory block will be described with reference to FIGS. 2, 3A and 3B.

In a method of operating the nonvolatile memory device according to example embodiments, a data write command is received (operation S100). For example, the data write command may be provided from an external memory controller, and a write address and data (e.g., target data or write data) to be written may be provided with the data write command.

Based on the data write command, a first program operation is performed on some wordlines among the plurality of wordlines connected to the memory block (operation S200). For example, the first program operation may be a normal (or general) program operation. By performing the first program operation, the target data may be programmed (or stored) in some memory cells connected to the some wordlines among the plurality of memory cells included in the memory block. As the first program operation is performed, the memory block may become an open block in which data is stored in some regions (e.g., the some regions have a program state) and data is not stored in other regions (e.g., the other regions have an erase state).

At least one of the some wordlines on which the first program operation is performed is detected as a no-coupled wordline (operation S300). In the open block, the some wordlines on which the first program operation is performed may be divided or classified into a coupled wordline (or a normal wordline) and the no-coupled wordline. The coupled wordline and the no-coupled wordline may have different characteristics. For example, the coupled wordline and the no-coupled wordline may have different threshold voltage distributions and different read levels. Thus, it may be desirable or necessary or required to manage (e.g., compensate) the no-coupled wordline included in the open block.

Without the data write command, a second program operation is performed on an open wordline on which the first program operation is not performed and adjacent to the no-coupled wordline (operation S400). For example, the second program operation may be a dummy program operation. As the second program operation is performed, the no-coupled wordline may be changed into the coupled wordline.

In some example embodiments, operations S300 and S400 may be performed after the first program operation in operation S200 is completed (e.g., terminated, finished or successfully completed). As described above, the second program operation may be performed without the data write command, and may not be included in the first program operation or may not be performed continuously with the first program operation. Thus, the second program operation may be performed independently of the first program operation after the first program operation is performed.

In the method of operating the nonvolatile memory device according to example embodiments, when the no-coupled wordline is detected in the open block after the memory block becomes the open block by performing the first program operation (e.g., the normal program operation) on a portion of the memory block, the no-coupled wordline in the open block may be formed as (e.g., changed into) the coupled wordline in advance by performing the second program operation (e.g., the dummy program operation) without the external command. Thus, the performance degradation may not occur because the default read failure due to the no-coupled wordline does not occur, and it may not be required to consider the no-coupled wordline for all read operations. Accordingly, the complexity of firmware may be reduced, the free resources may be reserved, and/or the firmware overhead and the performance degradation due to the no-coupled wordline may be reduced or minimized.

Figure 2:
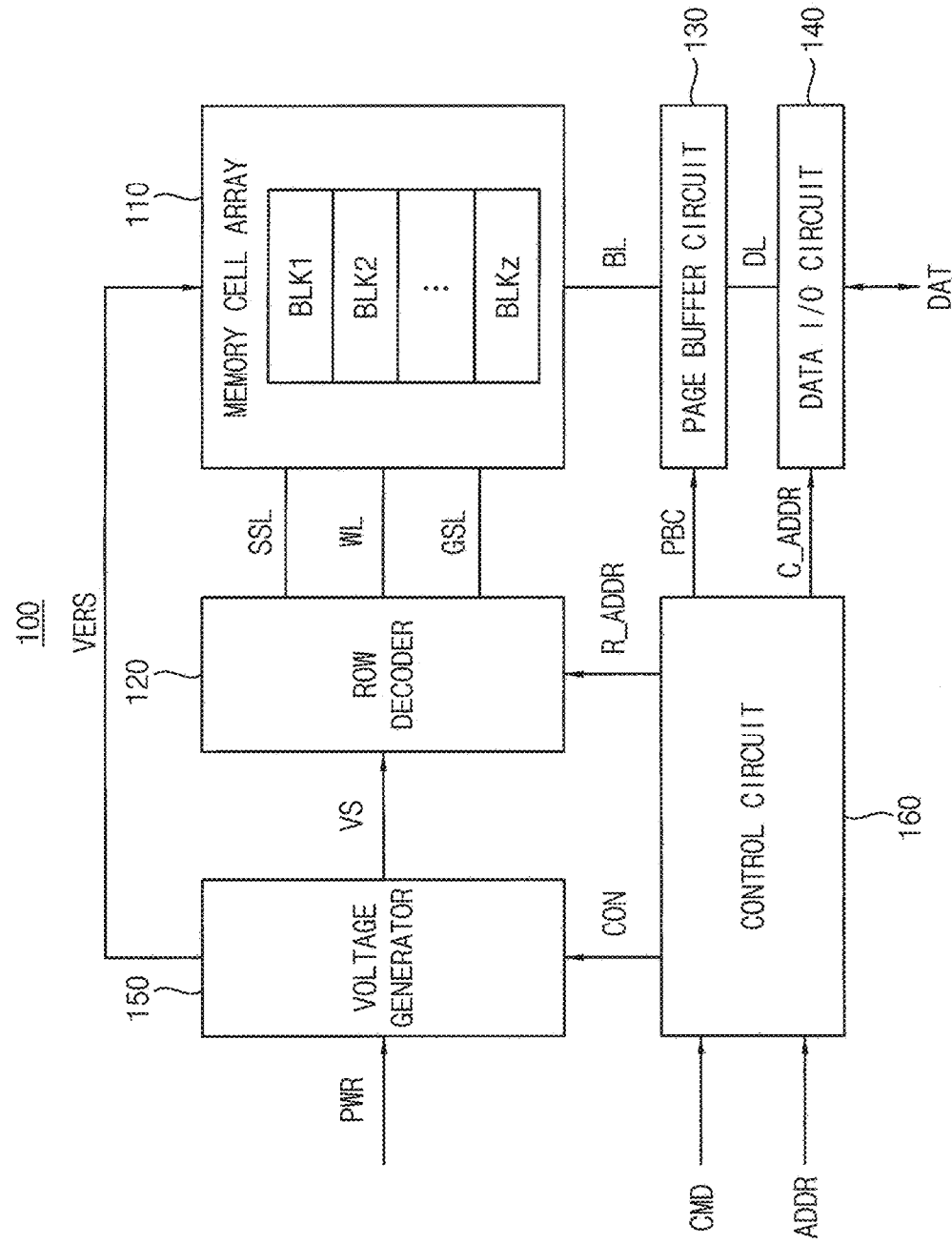
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 100 includes a memory cell array 110, a row decoder 120, a page buffer circuit 130, a data input/output (I/O) circuit 140, a voltage generator 150 and/or a control circuit 160.

The memory cell array 110 is connected to the row decoder 120 via a plurality of string selection lines SSL, a plurality of wordlines WL and a plurality of ground selection lines GSL. The memory cell array 110 is further connected to the page buffer circuit 130 via a plurality of bitlines BL.

The memory cell array 110 includes a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages. As will be described below with reference to FIGS. 3A and 3B, the plurality of memory cells may be arranged in a two-dimensional (2D) array structure or a three-dimensional (3D) vertical array structure.

The control circuit 160 receives a command CMD and an address ADDR from a memory controller (e.g., a memory controller 600 in FIG. 14), and control erasure, programming and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the row decoder 120 and may provide the column address C_ADDR to the data I/O circuit 140.

The control circuit 160 may perform the method according to example embodiments described with reference to FIG. 1. For example, the control circuit 160 receives a data write command, performs a first program operation on some wordlines among the plurality of wordlines connected to the memory block based on the data write command, detects at least one of the some wordlines on which the first program operation is performed as a no-coupled wordline, and performs a second program operation on an open wordline on which the first program operation is not performed and adjacent to the no-coupled wordline without the data write command. In addition, the control circuit 160 may perform a method according to example embodiments which will be described with reference to FIG. 11.

The row decoder 120 is connected to the memory cell array 110 via the plurality of string selection lines SSL, the plurality of wordlines WL and the plurality of ground selection lines GSL. The row decoder 120 selects the plurality of memory cells included in the memory cell array 110 on a wordline-by-wordline basis.

For example, in the data erase/write/read operations, the row decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the row decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the row decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are required for an operation of the nonvolatile memory device 100 based on a power PWR and the control signals CON. The voltages VS may be applied to the plurality of string selection lines SSL, the plurality of wordlines WL and the plurality of ground selection lines GSL via the row decoder 120. In addition, the voltage generator 150 may generate an erase voltage VERS that is required for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the row decoder 120. In addition, during the erase verification operation, the voltage generator 150 may apply an erase verification voltage simultaneously to all wordlines of the memory block or sequentially to the wordlines one by one.

For example, during the program operation, the voltage generator 150 may apply a program voltage to the selected wordline and may apply a program pass voltage to the unselected wordlines via the row decoder 120. In addition, during the program verification operation, the voltage generator 150 may apply a program verification voltage to the selected wordline and may apply a verification pass voltage to the unselected wordlines via the row decoder 120.

In addition, during the normal read operation, the voltage generator 150 may apply a read voltage to the selected wordline and may apply a read pass voltage to the unselected wordlines via the row decoder 120. During the data recover read operation, the voltage generator 150 may apply the read voltage to a wordline adjacent to the selected wordline and may apply a recover read voltage to the selected wordline via the row decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 14) to the memory cell array 110 via the page buffer circuit 130 or may provide the data DAT from the memory cell array 110 to the outside of the nonvolatile memory device 100, based on the column address C_ADDR.

Figure 3A:
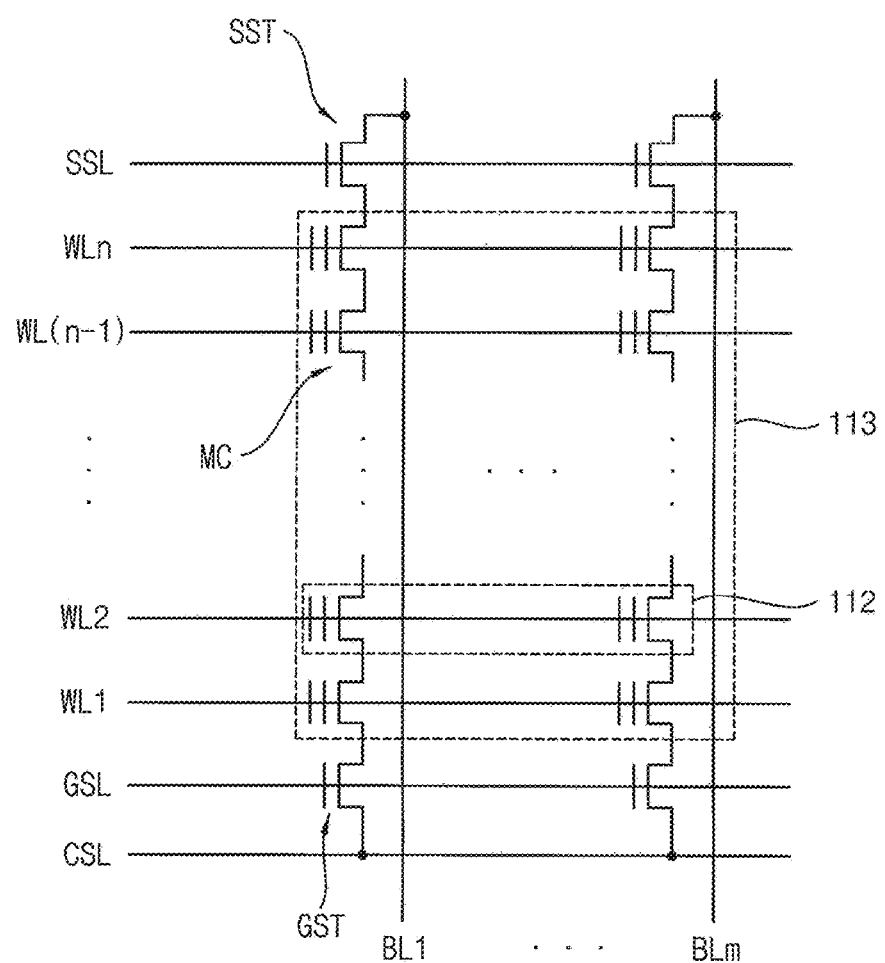
FIGS. 3A and 3B are diagrams illustrating examples of a memory cell array that is included in a nonvolatile memory device of FIG. 2.
Figure 3B:
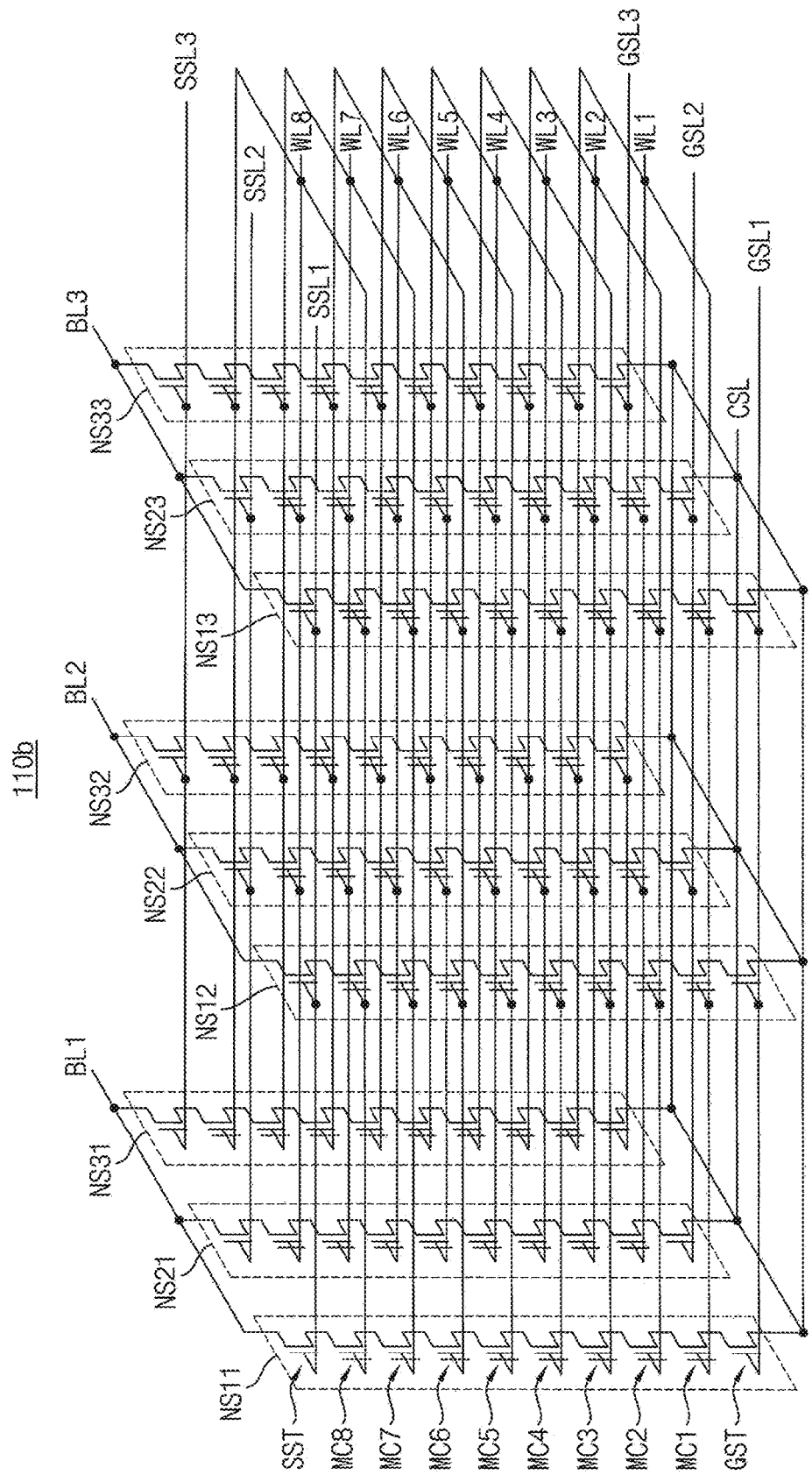

FIGS. 3A and 3B are diagrams illustrating examples of a memory cell array that is included in a nonvolatile memory device of FIG. 2. FIG. 3A is a circuit diagram illustrating an example of a memory cell array included in a NAND flash memory device. FIG. 3B is a circuit diagram illustrating an example of a memory cell array included in a vertical NAND flash memory device.

Referring to FIG. 3A, a memory cell array 110*a* may include string selection transistors SST, ground selection transistors GST, and memory cells MC. The string selection transistors SST may be connected to bitlines BL1, . . . , BLm, and the ground selection transistors GST may be connected to a common source line CSL. The memory cells arranged in the same row may be disposed in series between one of the bitlines BL1~BLm and the common source line CSL, and the memory cells arranged in the same column may be connected in common to one of wordlines WL1, WL2, . . . , WL(n−1), WLn. In other words, the memory cells MC may be connected in series between the string selection transistors SST and the ground selection transistors GST, and 16, 32, or 64 wordlines may be disposed between a string selection line SSL connected to the string selection transistors SST and a ground selection line GSL connected to the ground selection transistors GST.

The string selection transistors SST may be connected to the string selection line SSL such that the string selection transistors SST are controlled according to a level of a voltage applied from the string selection line SSL. The ground selection transistors GST may be connected to the ground selection line GSL such that the ground selection transistors GST are controlled according to a level of a voltage applied from the ground selection line GSL. The memory cells MC may be controlled according to levels of voltages applied to the wordlines WL1~WLn.

A nonvolatile memory device including the memory cell array 110*a* may perform the data read and write (or program) operations in units of page 112 and the data erase operation in units of block 113.

Referring to FIG. 3B, one memory block 110*b* of the memory cell array is illustrated. The memory block 110*b* of FIG. 3B may be formed on a substrate in a three-dimensional structure (or a vertical structure). For example, a plurality of cell strings (e.g., vertical NAND strings) included in the memory block 110*b* may be formed in a direction perpendicular to the substrate.

The memory block 110*b* may include a plurality of cell strings NS11, NS12, NS13, NS21, NS22, NS23, NS31, NS32 and NS33 connected between bitlines BL1, BL2 and BL3 and a common source line CSL. Each of the cell strings NS11~NS33 may include a string selection transistor SST, a plurality of memory cells MC1, MC2, MC3, MC4, MC5, MC6, MC7 and MC8 and a ground selection transistor GST.

Each string selection transistor SST may be connected to a corresponding string selection line (one of SSL1, SSL2 and SSL3). The plurality of memory cells MC1~MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1~BL3), and each ground selection transistor GST may be connected to the common source line CSL.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1~GSL3 and the string selection lines SSL1~SSL3 may be separated. Memory cells located at the same semiconductor layer may share a wordline. Cell strings in the same row may share a string selection line. The common source line CSL may be connected in common to all of cell strings.

In FIG. 3B, the memory block 110*b* is illustrated to be connected to eight wordlines WL1~WL8 and three bitlines BL1~BL3, and each of the cell strings NS11~NS33 is illustrated to include eight memory cells MC1~MC8. However, inventive concepts are not limited thereto. In some example embodiments, each memory block in the memory cell array 110 may be connected to any number of wordlines and bitlines, and/or each cell string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 4:
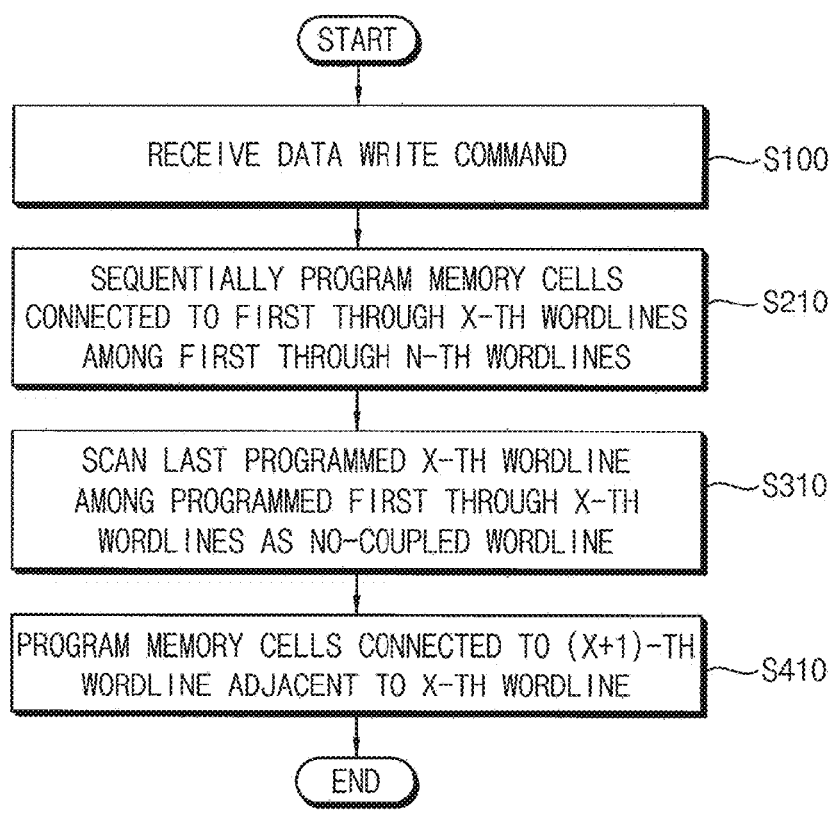
FIG. 4 is a flowchart illustrating an example of a method of operating a nonvolatile memory device of FIG. 1.

FIG. 4 is a flowchart illustrating an example of a method of operating a nonvolatile memory device of FIG. 1.

Referring to FIGS. 1 and 4, the plurality of wordlines that are connected to the memory block included in the nonvolatile memory device according to example embodiments may include a first wordline through an N-th wordline, where N is a natural number greater than or equal to two.

In the method of operating the nonvolatile memory device according to example embodiments, operation S100 in FIG. 4 may be substantially the same as operation S100 in FIG. 1.

When performing the first program operation on the some wordlines based on the data write command (operation S200), memory cells connected to the first wordline through an X-th wordline among the first through N-th wordlines may be sequentially programmed (operation S210), where X is a natural number greater than or equal to one and less than or equal to (N−1). For example, memory cells connected to the first wordline may be sequentially programmed first, and then memory cells connected to the second wordline may be sequentially programmed, and finally memory cells connected to the X-th wordline may be sequentially programmed. As described with reference to FIG. 1, the first program operation may be the normal program operation.

When detecting the at least one of the some wordlines as the no-coupled wordline (operation S300), the programmed X-th wordline among the programmed first through X-th wordlines may be scanned as the no-coupled wordline (operation S310). The programmed X-th wordline may be a last programmed wordline. In other words, the last programmed wordline in the open block may be detected as the no-coupled wordline.

When performing the second program operation on the open wordline without the data write command (operation S400), memory cells connected to an (X+1)-th wordline on which the first program operation is not performed and adjacent to the X-th wordline may be programmed (operation S410). As described with reference to FIG. 1, the second program operation may be the dummy program operation.

In the method of operating the nonvolatile memory device according to example embodiments, the dummy program operation may not be performed on all memory cells connected to all wordlines (e.g., the (X+1)-th through N-th wordlines) that are not programmed in the open block, and the dummy program operation may be performed only on the memory cells connected to the (X+1)-th wordline adjacent to the X-th wordline that is the no-coupled wordline. In other words, the dummy program operation may be performed to the extent that the influence of the no-coupled wordline in the open block is eliminated. Thus, the performance degradation due to the no-coupled wordline may be reduced or prevented while reducing or minimizing the dummy program operation.

Figure 5A:
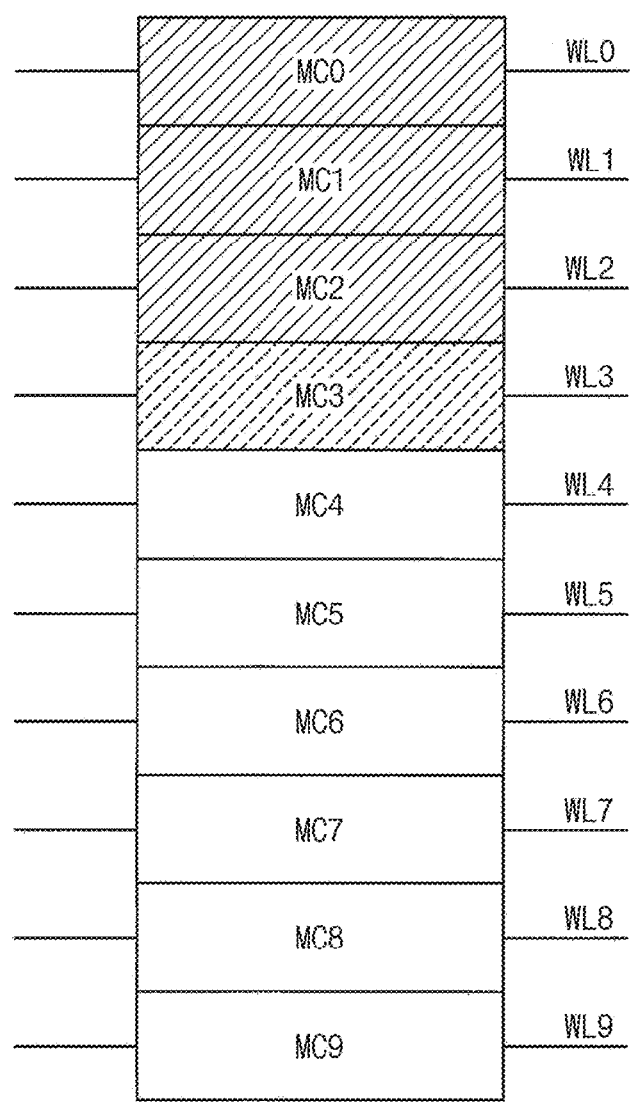
FIGS. 5A and 5B are diagrams for describing a method of operating a nonvolatile memory device of FIG. 4.
Figure 5B:
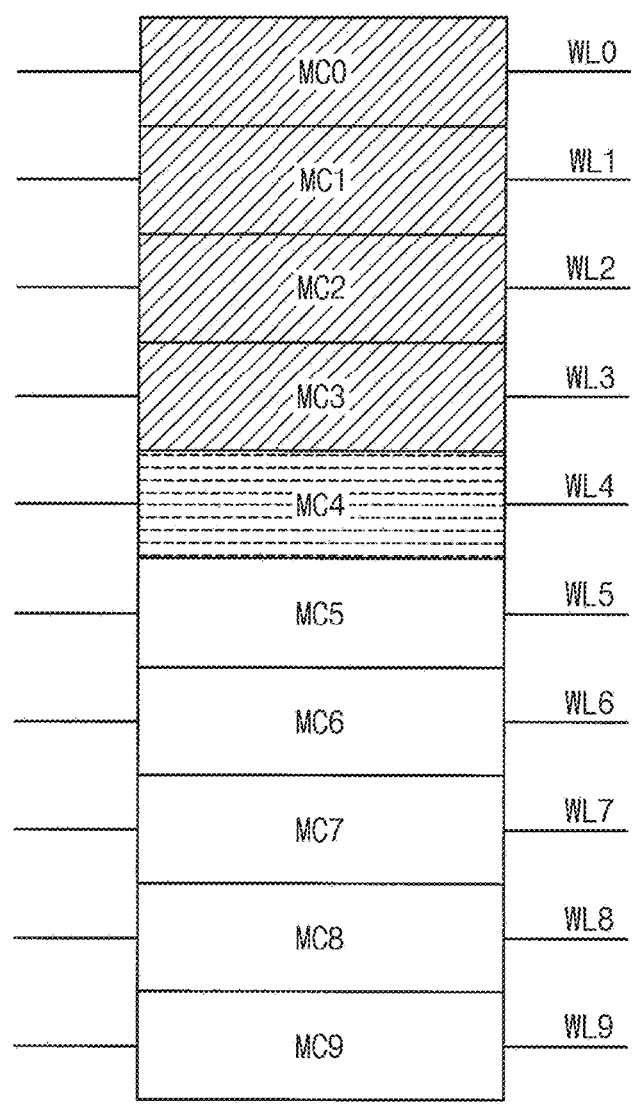

FIGS. 5A and 5B are diagrams for describing a method of operating a nonvolatile memory device of FIG. 4. FIGS. 5A and 5B illustrate an example of a memory block included in the NAND flash memory device illustrated in FIG. 3A, and illustrate an example in which N=10 and X=4 in the embodiment of FIG. 4.

Referring to FIGS. 5A and 5B, a memory block BLKa may be connected to wordlines WL0, WL1, WL2, WL3, WL4, WL5, WL6, WL7, WL8 and WL9, and may include memory cells MC0, MC1, MC2, MC3, MC4, MC5, MC6, MC7, MC8 and MC9. The memory cells MC0 may be connected to the wordline WL0, and similarly, the memory cells MC1, MC2, MC3, MC4, MC5, MC6, MC7, MC8 and MC9 may be connected to the wordlines WL1, WL2, WL3, WL4, WL5, WL6, WL7, WL8 and WL9, respectively.

As illustrated in FIG. 5A, the first program operation of sequentially programming the memory cells MC0, MC1, MC2 and MC3 connected to the first through fourth wordlines WL0, WL1, WL2 and WL3 of the memory block BLKa may be performed. In this example, each of the programmed first through third wordlines WL0, WL1 and WL2 may become the coupled wordline, the last programmed fourth wordline WL3 may become the no-coupled wordline, and each of the fifth through tenth wordlines WL4, WL5, WL6, WL7, WL8 and WL9 (e.g., the unprogrammed wordlines) on which the first program operation is not performed may become the open wordline. In FIG. 5A, the memory cells MC0, MC1 and MC2 connected to the coupled wordline are hatched by solid lines, the memory cells MC3 connected to the no-coupled wordline are hatched by dotted lines, and the memory cells MC4, MC5, MC6, MC7, MC8 and MC9 connected to the open wordline are not hatched. After the first program operation is completed, the fourth wordline WL3 may be detected as the no-coupled wordline.

As illustrated in FIG. 5B, the second program operation of sequentially programming the memory cells MC4 connected to the fifth wordline WL4 may be performed. The fifth wordline WL4 may be one of the open wordlines on which the first program operation is not performed and may be adjacent to the fourth wordline WL3 that is the no-coupled wordline. Thus, the fourth wordline WL3 may be changed from the no-coupled wordline to the coupled wordline. In FIG. 5B, the memory cells MC3 connected to the fourth wordline WL3 that is changed into the coupled wordline are hatched by solid lines, and the memory cells MC4 connected to the fifth wordline WL4 are hatched by horizontal dotted lines because the second program operation is the dummy program operation different from the first program operation. The memory cells MC0, MC1, MC2, MC5, MC6, MC7, MC8 and MC9 connected to the other wordlines WL0, WL1, WL2, WL5, WL6, WL7, WL8 and WL9 may maintain the same state as illustrated in FIG. 5A even if the second program operation is performed.

Figure 6:
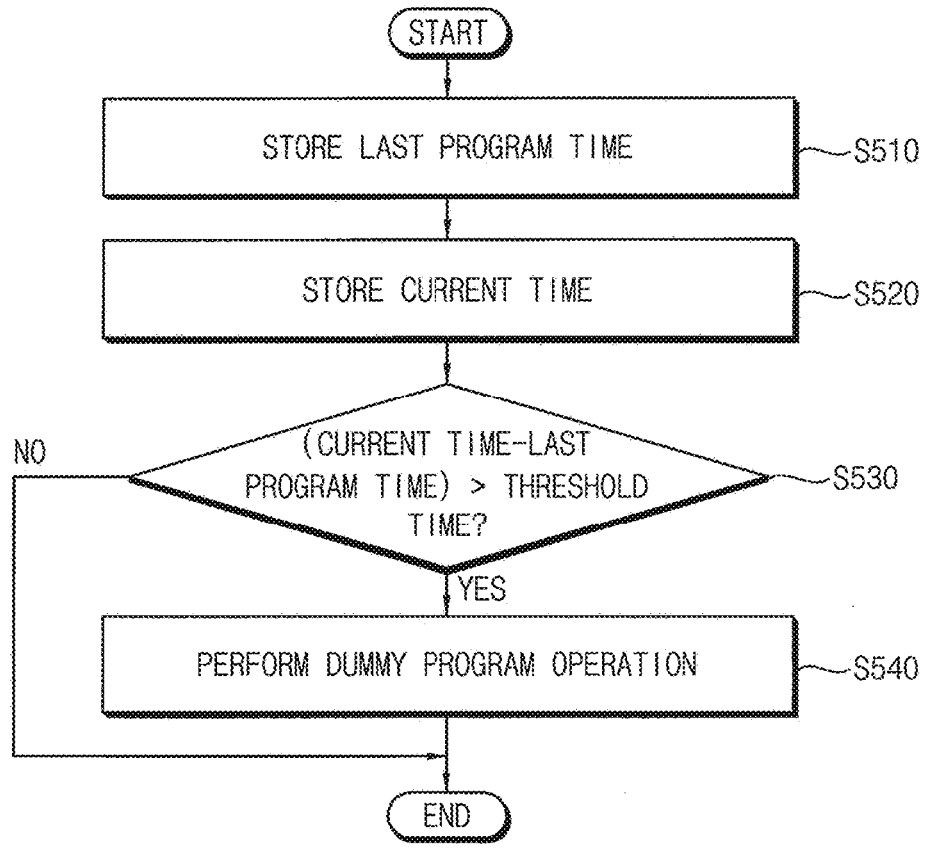
FIGS. 6 and 7 are flowcharts illustrating examples of performing a second program operation in FIG. 1.
Figure 7:
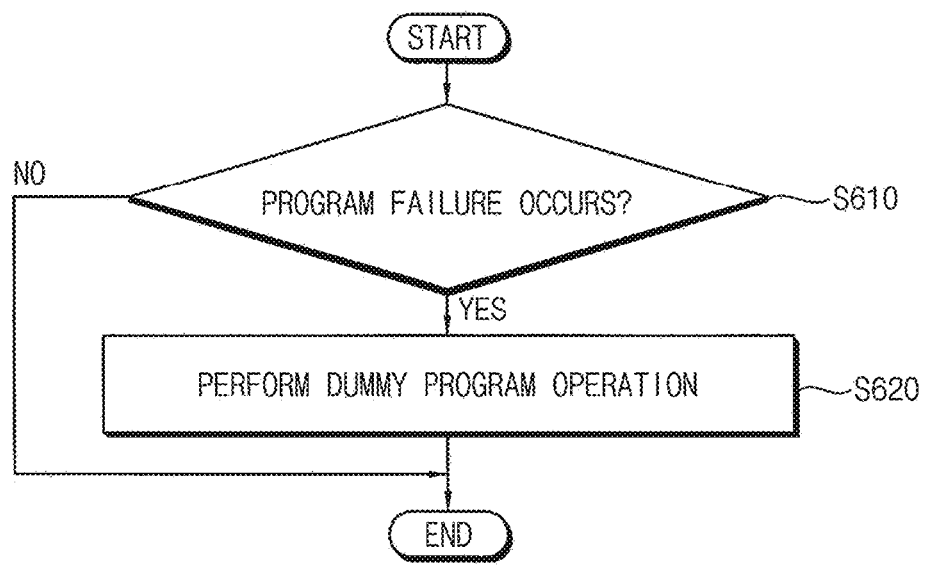

FIGS. 6 and 7 are flowcharts illustrating examples of performing a second program operation in FIG. 1.

Referring to FIGS. 1 and 6, when performing the second program operation (operation S400), a last program time that is a time point at which the first program operation is terminated may be stored (operation S510). For example, as described with reference to FIGS. 4, 5A and 5B, when the memory cells connected to the first through X-th wordlines are sequentially programmed, a program time of the memory cells connected to the last X-th wordline (e.g., a program time of the memory cells MC3 connected to the fourth wordline WL3 in FIG. 5A) may be stored.

After the first program operation is completed, a current time may be stored (operation S520), and a first time that is a time difference between the current time and the last program time may be compared with a predetermined threshold time (operation S530). In other words, it may be determined whether the threshold time has elapsed from the last program time.

When the first time is longer than the threshold time (operation S530: YES), memory cells connected to the open wordline on which the first program operation is not performed and adjacent to the no-coupled wordline may be programmed (operation S540). For example, as described with reference to FIGS. 4, 5A and 5B, when the X-th wordline is detected as the no-coupled wordline, the memory cells connected to the (X+1)-th wordline adjacent to the X-th wordline (e.g., the memory cells MC4 connected to the fifth wordline WL4 in FIG. 5B) may be programmed.

When the first time is shorter than or equal to the threshold time (operation S530: NO), the procedure may be terminated without performing operation S540.

In some example embodiments, the program operation performed in operation S540 may be the dummy program operation for programming dummy data in memory cells connected to the open wordline. For example, the dummy data may include a random pattern. As described above, after the dummy program operation is performed, the no-coupled wordline may be changed into the coupled wordline.

In the method of operating the nonvolatile memory device described with reference to FIG. 6, the dummy program operation may be performed using the last program time as a majority parameter or factor. In other words, the last program time is the most important parameter for the dummy program operation, regardless of the program scheme, regardless of a write area (e.g., an area in which the target data is stored by the first program operation) in a memory block, and regardless of the host command (e.g., the data write command received from outside). If the program operation is not performed after a certain time elapses from the last program time, the dummy program operation may be performed on the wordline adjacent to the last programmed wordline to protect the last programmed wordline.

Referring to FIGS. 1 and 7, when performing the second program operation (operation S400), it may be determined whether a program failure occurs while the first program operation is performed (operation S610).

When the program failure occurs (operation S610: YES), memory cells connected to the open wordline on which the first program operation is not performed and adjacent to the no-coupled wordline may be programmed (operation S620). For example, when the program loop is repeated more than a predetermined or alternatively, desired number of times but the program verification operation is not successfully completed, it may be determined that a program failure occurred, and a wordline in which the program failure occurs may correspond to the last programmed wordline described with reference to FIG. 6. Operation S620 in FIG. 7 may be substantially the same as operation S540 in FIG. 6.

When the program failure does not occur (operation S610: NO), the procedure may be terminated without performing operation S620.

In some example embodiments, the second program operation (e.g., the dummy program operation) performed in operation S540 in FIG. 6 and operation S620 in FIG. 7 may be performed while the nonvolatile memory device is powered off. For example, a case in which the nonvolatile memory device is powered off may include a sudden power off (SPO) case in which a power of the nonvolatile memory device is suddenly turned off, and a normal power off (NPO) case in which the power of the nonvolatile memory device is turned off according to a predetermined or alternatively, desired procedure.

In other example embodiments, the second program operation performed in operation S540 in FIG. 6 and operation S620 in FIG. 7 may be performed while the nonvolatile memory device is powered on and a power of the nonvolatile memory device is maintained.

However, example embodiments are not limited thereto, and the second program operation may be performed at any time the nonvolatile memory device is driven.

Figure 8A:
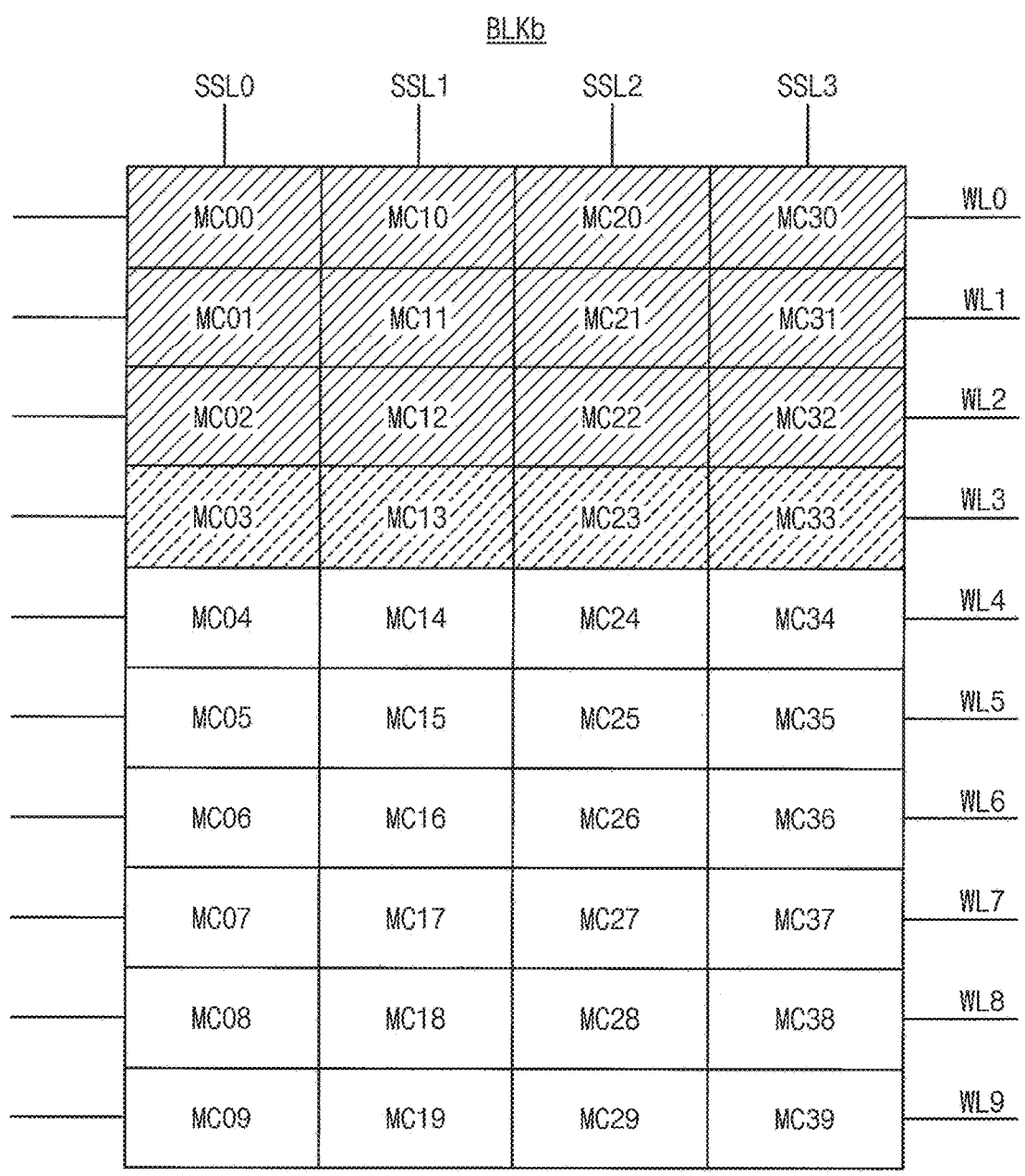
FIGS. 8A and 8B are diagrams for describing a method of operating a nonvolatile memory device of FIG. 4.
Figure 8B:
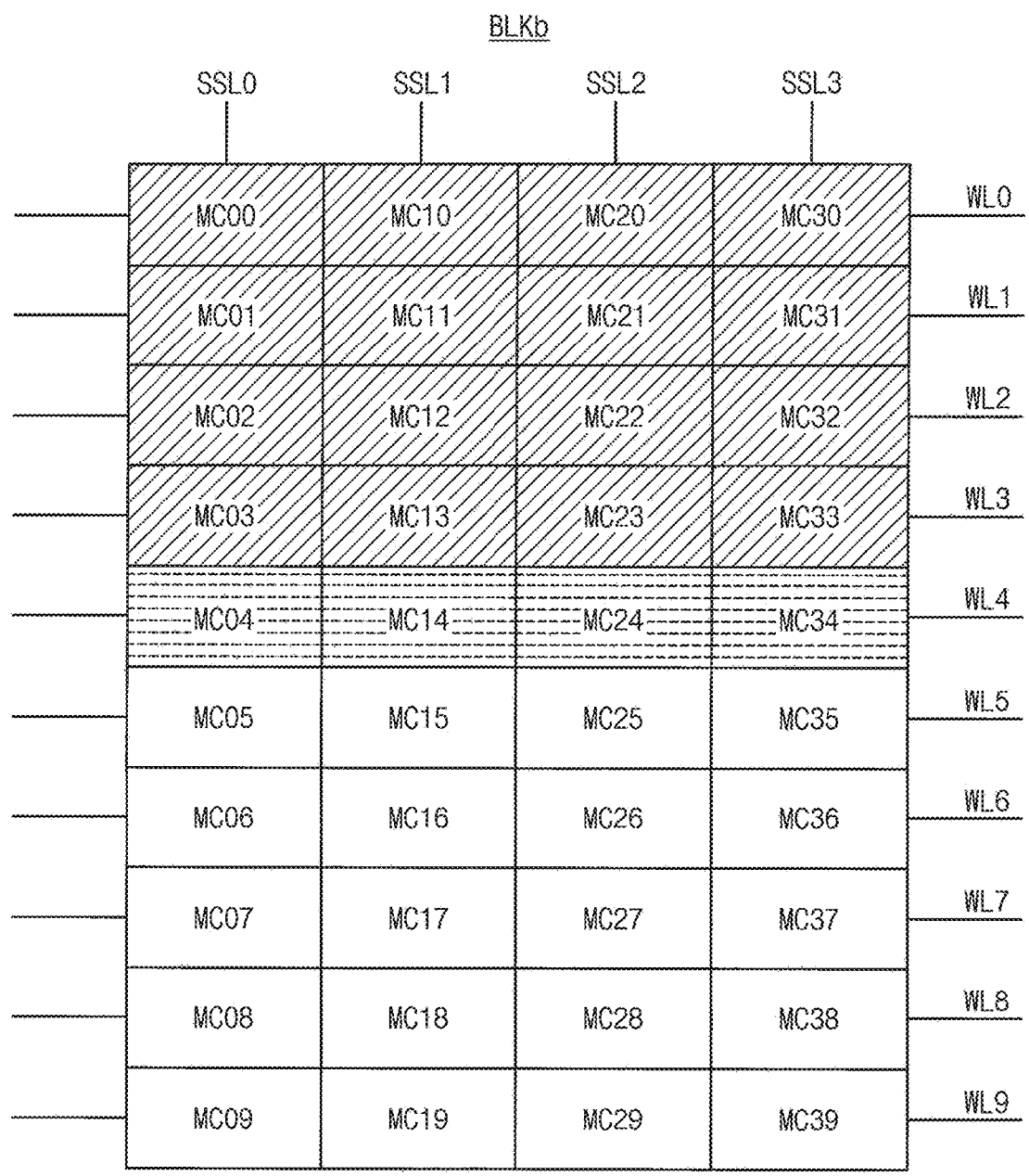

FIGS. 8A and 8B are diagrams for describing a method of operating a nonvolatile memory device of FIG. 4. FIGS. 8A and 8B illustrate an example of a memory block included in the vertical NAND flash memory device illustrated in FIG. 3B, and illustrate an example in which N=10 and X=4 in the embodiment of FIG. 4. The descriptions repeated with FIGS. 5A and 5B will be omitted.

Referring to FIGS. 8A and 8B, a memory block BLKb may be connected to wordlines WL0, WL1, WL2, WL3, WL4, WL5, WL6, WL7, WL8 and WL9, may be connected to string selection lines SSL0, SSL1, SSL2 and SSL3, and may include memory cells MC00, MC01, MC02, MC03, MC04, MC05, MC06, MC07, MC08, MC09, MC10, MC11, MC12, MC13, MC14, MC15, MC16, MC17, MC18, MC19, MC20, MC21, MC22, MC23, MC24, MC25, MC26, MC27, MC28, MC29, MC30, MC31, MC32, MC33, MC34, MC35, MC36, MC37, MC38 and MC39. The memory cells MC00, MC10, MC20 and MC30 may be connected to the wordline WL0, and similarly, the memory cells MC01, MC11, MC21, MC31, MC02, MC12, MC22, MC32, MC03, MC13, MC23, MC33, MC04, MC14, MC24, MC34, MC05, MC15, MC25, MC35, MC06, MC16, MC26, MC36, MC07, MC17, MC27, MC37, MC08, MC18, MC28, MC38, MC09, MC19, MC29 and MC39 may be connected to the wordlines WL1, WL2, WL3, WL4, WL5, WL6, WL7, WL8 and WL9, respectively. The memory cells MC00, MC01, MC02, MC03, MC04, MC05, MC06, MC07, MC08 and MC09 may be connected to the string selection line SSL0, and similarly, the memory cells MC10, MC11, MC12, MC13, MC14, MC15, MC16, MC17, MC18, MC19, MC20, MC21, MC22, MC23, MC24, MC25, MC26, MC27, MC28, MC29, MC30, MC31, MC32, MC33, MC34, MC35, MC36, MC37, MC38 and MC39 may be connected to the string selection lines SSL1, SSL2 and SSL3, respectively.

As illustrated in FIG. 8A, the first program operation of sequentially programming the memory cells MC00, MC10, MC20, MC30, MC01, MC11, MC21, MC31, MC02, MC12, MC22, MC32, MC03, MC13, MC23 and MC33 connected to the first through fourth wordlines WL0, WL1, WL2 and WL3 of the memory block BLKb may be performed. In this example, each of the programmed first through third wordlines WL0, WL1 and WL2 may become the coupled wordlines, the last programmed fourth wordline WL3 may become the no-coupled wordline, and each of the fifth through tenth wordlines WL4, WL5, WL6, WL7, WL8 and WL9 on which the first program operation is not performed may become the open wordlines.

As illustrated in FIG. 8B, the second program operation of sequentially programming the memory cells MC04, MC14, MC24 and MC34 connected to the fifth wordline WL4 may be performed. The fifth wordline WL4 may be one of the open wordlines on which the first program operation is not performed and may be adjacent to the fourth wordline WL3 that is the no-coupled wordline. Thus, the fourth wordline WL3 may be changed from the no-coupled wordline to the coupled wordline.

Figure 9:
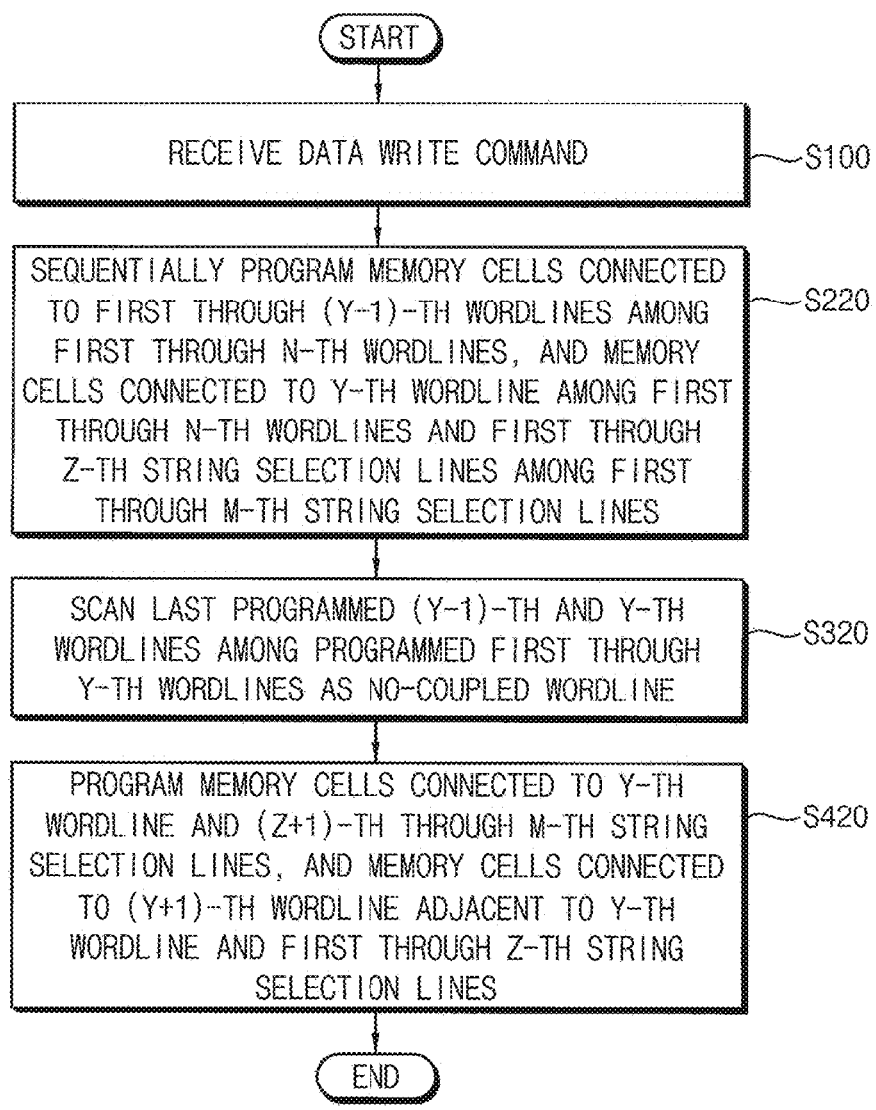
FIG. 9 is a flowchart illustrating another example of a method of operating a nonvolatile memory device of FIG. 1.

FIG. 9 is a flowchart illustrating another example of a method of operating a nonvolatile memory device of FIG. 1. The descriptions repeated with FIG. 4 will be omitted.

Referring to FIGS. 1 and 9, the plurality of wordlines that are connected to the memory block included in the nonvolatile memory device according to example embodiments may include the first through N-th wordlines. In addition, the memory block may be connected to a plurality of string selection lines, and the plurality of string selection lines may include a first string selection line through an M-th string selection line, where M is a natural number greater than or equal to two.

In the method of operating the nonvolatile memory device according to example embodiments, operation S100 in FIG. 9 may be substantially the same as operation S100 in FIG. 1.

When performing the first program operation on the some wordlines based on the data write command (operation S200), memory cells connected to the first wordline through a (Y−1)-th wordline among the first through N-th wordlines, and memory cells connected to a Y-th wordline among the first through N-th wordlines and connected to the first string selection line through a Z-th string selection line among the first through M-th string selection lines may be sequentially programmed (operation S220), where Y is a natural number greater than or equal to two and less than or equal to (N−1), and Z is a natural number greater than or equal to one and less than or equal to (M−1). For example, memory cells connected to the first wordline and connected to the first through M-th string selection lines may be sequentially programmed first, and then memory cells connected to the second wordline and connected to the first through M-th string selection lines may be sequentially programmed, and then memory cells connected to the (Y−1)-th wordline and connected to the first through M-th string selection lines may be sequentially programmed, and finally memory cells connected to the Y-th wordline and connected to the first through Z-th string selection lines may be sequentially programmed.

When detecting the at least one of the some wordlines as the no-coupled wordline (operation S300), the programmed (Y−1)-th and Y-th wordlines among the programmed first through Y-th wordlines may be scanned as the no-coupled wordline (operation S320). The programmed (Y−1)-th and Y-th wordlines may be last programmed wordlines.

When performing the second program operation on the open wordline without the data write command (operation S400), memory cells connected to the Y-th wordline and connected to a (Z+1)-th string selection line through the M-th string selection line, and memory cells connected to a (Y+1)-th wordline adjacent to the Y-th wordline and connected to the first string selection line through the Z-th string selection line may be programmed (operation S420).

Figure 10A:
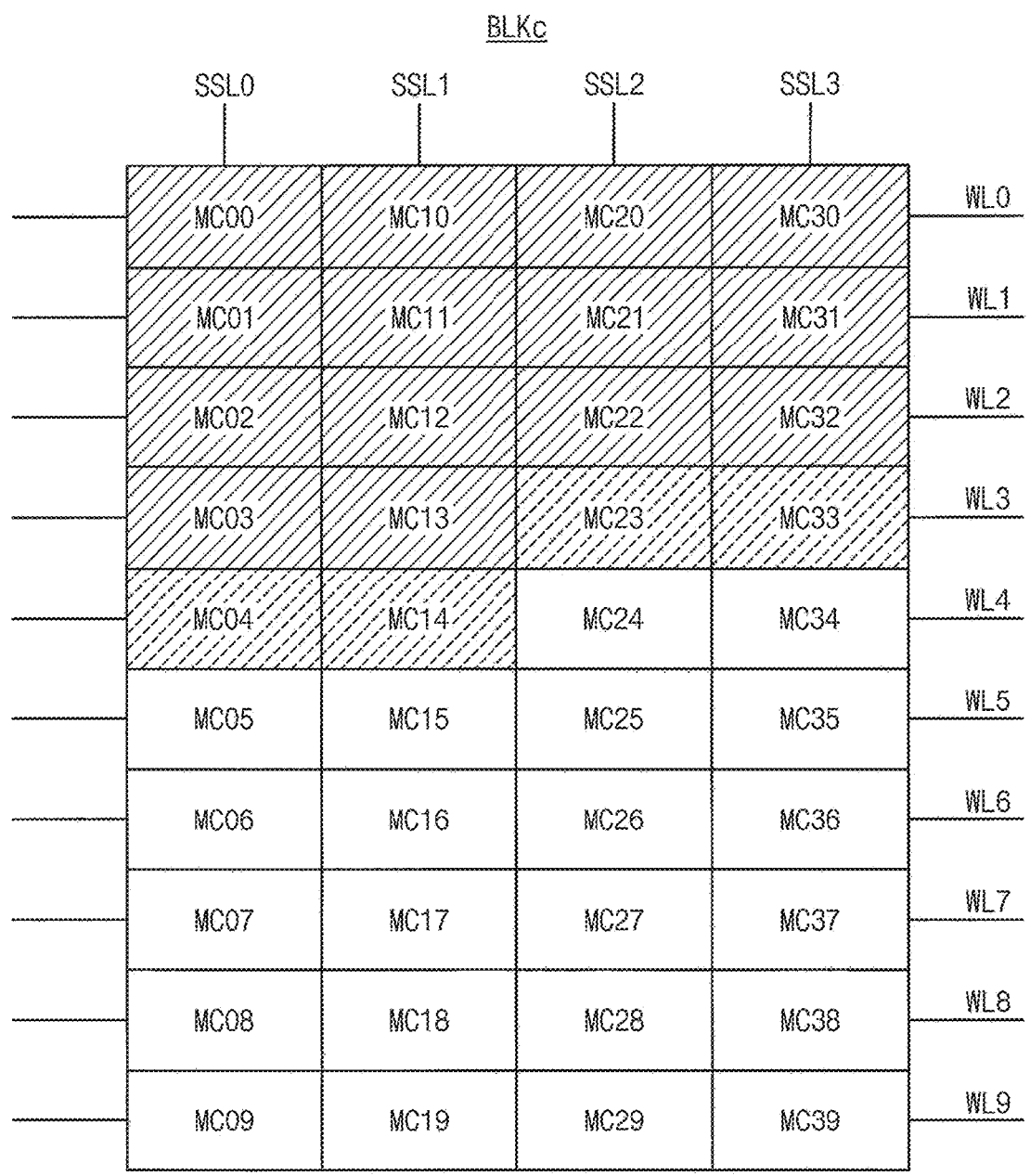
FIGS. 10A and 10B are diagrams for describing a method of operating a nonvolatile memory device of FIG. 9.
Figure 10B:
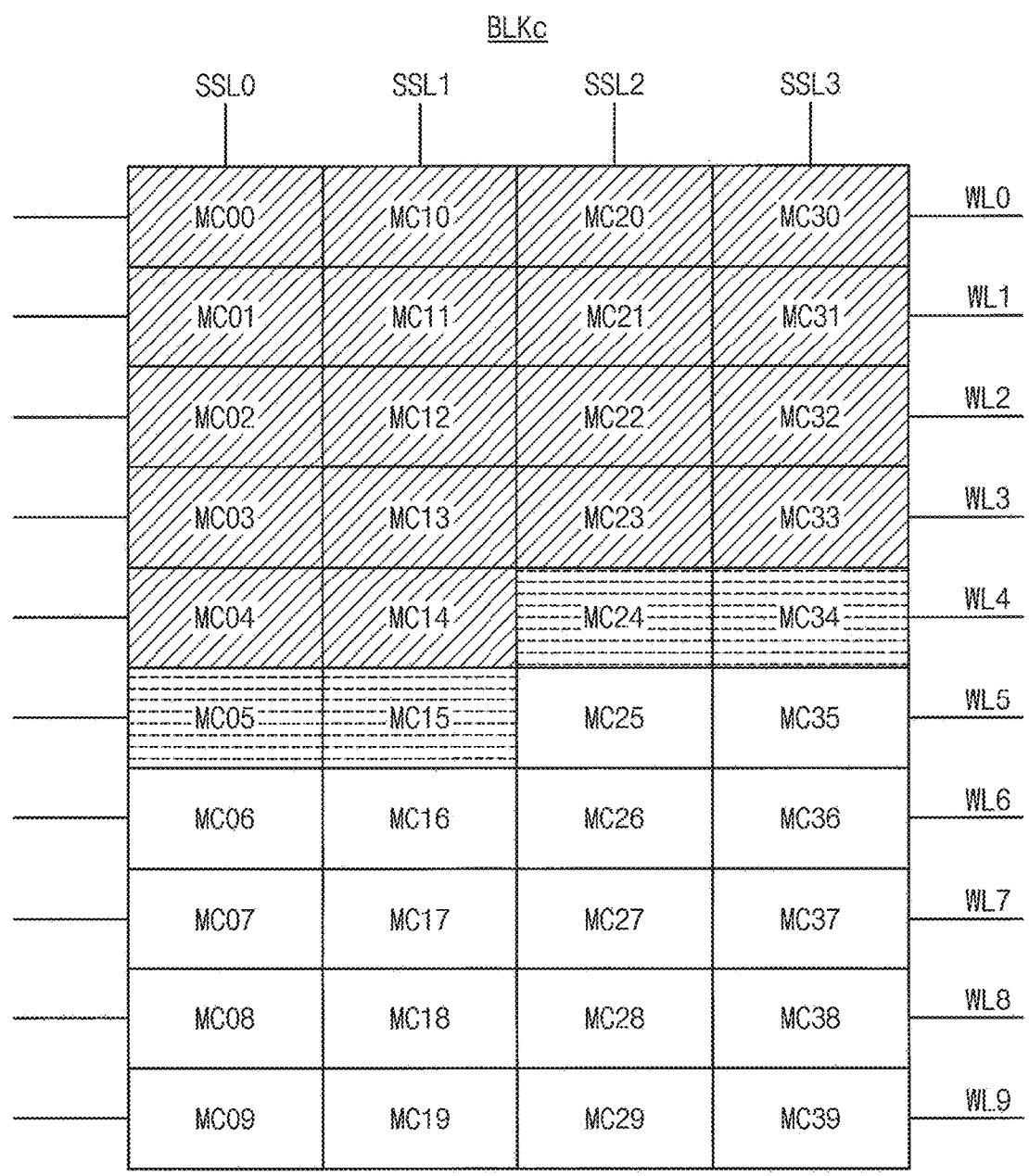

FIGS. 10A and 10B are diagrams for describing a method of operating a nonvolatile memory device of FIG. 9. FIGS. 10A and 10B illustrate an example of a memory block included in the vertical NAND flash memory device illustrated in FIG. 3B, and illustrate an example in which N=10, M=4, Y=5 and Z=2 in the embodiment of FIG. 9. The descriptions repeated with FIGS. 5A, 5B, 8A and 8B will be omitted.

Referring to FIGS. 10A and 10B, a memory block BLKc may have a structure substantially the same as that of the memory block BLKb in FIGS. 8A and 8B.

As illustrated in FIG. 10A, the first program operation of sequentially programming the memory cells MC00, MC10, MC20, MC30, MC01, MC11, MC21, MC31, MC02, MC12, MC22, MC32, MC03, MC13, MC23 and MC33 connected to the first through fourth wordlines WL0, WL1, WL2 and WL3 and connected to the first through fourth string selection lines SSL0, SSL1, SSL2 and SSL3 of the memory block BLKc, and sequentially programming the memory cells MC04 and MC14 connected to the fifth wordline WL4 and connected to the first and second string selection lines SSL0 and SSL1 of the memory block BLKc may be performed. In this example, each of the programmed first through third wordlines WL0, WL1 and WL2 may become the coupled wordline, each of the last programmed fourth and fifth wordlines WL3 and WL4 may become the no-coupled wordline, and each of the sixth through tenth wordlines WL5, WL6, WL7, WL8 and WL9 on which the first program operation is not performed may become the open wordline.

As illustrated in FIG. 10B, the second program operation of sequentially programming the memory cells MC24 and MC34 connected to the fifth wordline WL4 and connected to the third and fourth string selection lines SSL2 and SSL3, and sequentially programming the memory cells MC05 and MC15 connected to the sixth wordline WL5 adjacent to the fifth wordline WL4 and connected to the first and second string selection lines SSL0 and SSL1 may be performed. Thus, the fourth wordline WL3 may be changed from the no-coupled wordline to the coupled wordline.

Figure 11:
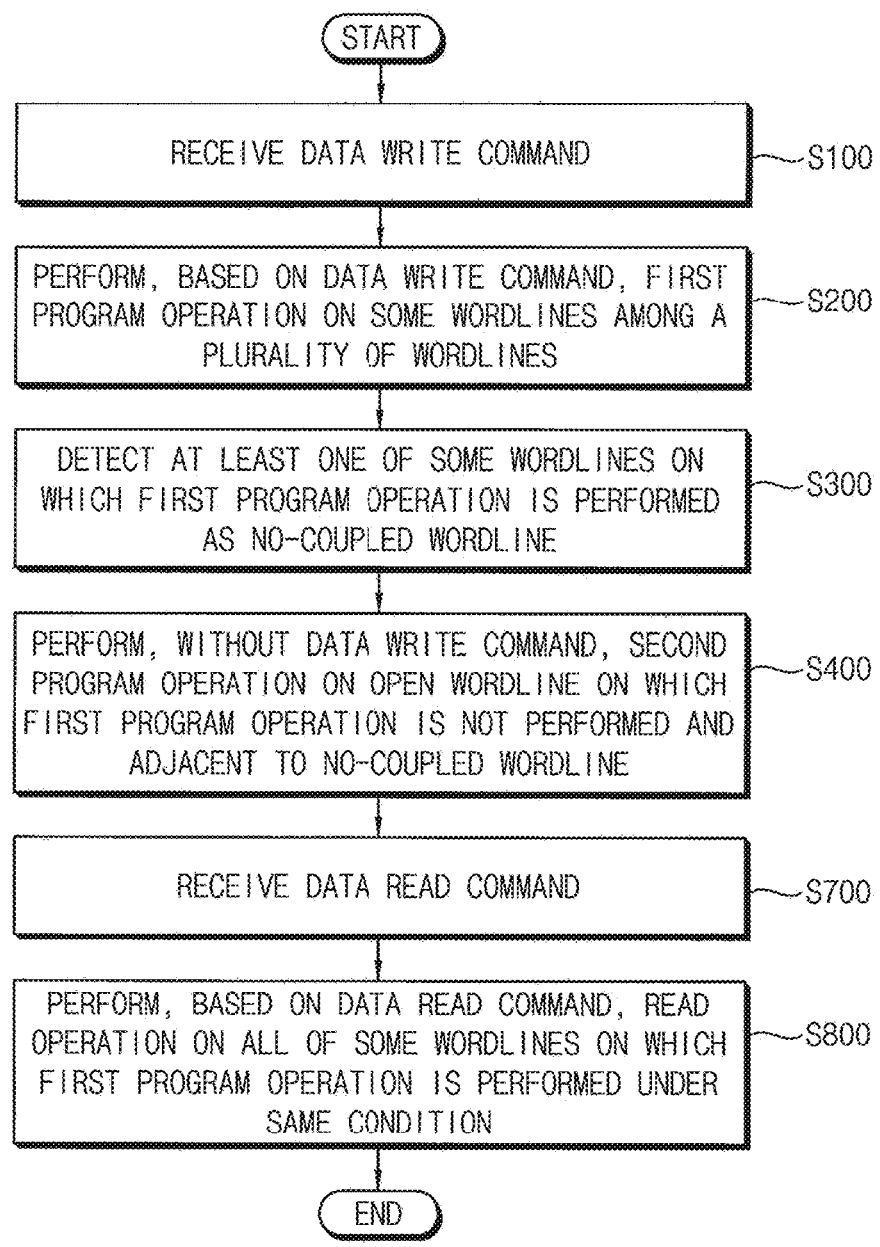
FIG. 11 is a flowchart illustrating a method of operating a nonvolatile memory device according to example embodiments.

FIG. 11 is a flowchart illustrating a method of operating a nonvolatile memory device according to example embodiments. The descriptions repeated with FIG. 1 will be omitted.

Referring to FIG. 11, in a method of operating a nonvolatile memory device according to example embodiments, operations S100, S200, S300 and S400 in FIG. 11 may be substantially the same as operations S100, S200, S300 and S400 in FIG. 1, respectively.

After operations S100, S200, S300 and S400 are performed, a data read command is received (operation S700). For example, as with the data write command, the data read command may be provided from the external memory controller, and a read address may be provided with the data read command. For example, the read address may correspond to the write address.

Based on the data read command, a read operation is performed on all of the some wordlines on which the first program operation is performed under the same condition (operation S800). For example, as will be described with reference to FIGS. 12 and 13, the read operation may be performed based on a read voltage having the same level.

After then, the target data may be transmitted to the external memory controller as a result of the read operation.

In the method of operating the nonvolatile memory device according to example embodiments, the no-coupled wordline in which valid data is stored may be formed as (e.g., changed into) the coupled wordline in advance by performing the second program operation (e.g., by performing the dummy program operation of programming the dummy data into a wordline subsequent to the no-coupled wordline) without the external command. Accordingly, the read operation may be efficiently performed without the read error and without the read retry even if the read voltage having the same level is used.

Figure 12:
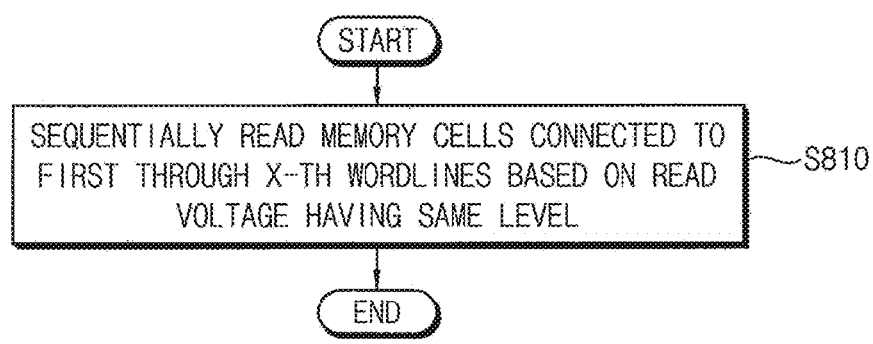
FIGS. 12 and 13 are flowcharts illustrating examples of performing a read operation in FIG. 11.
Figure 13:
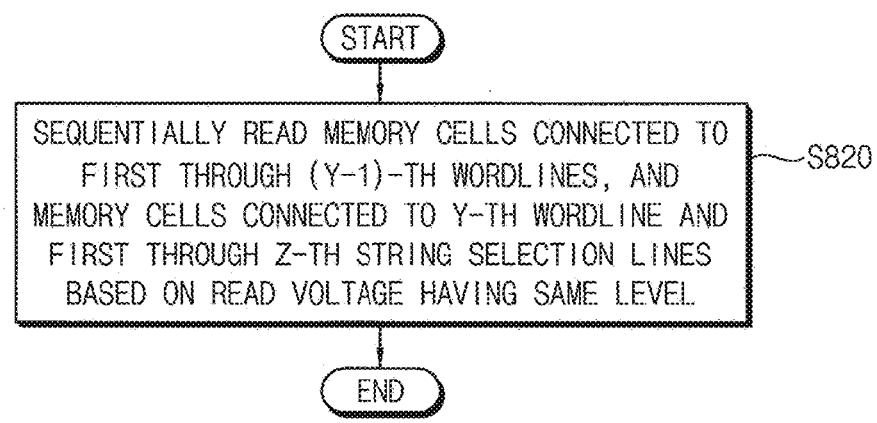

FIGS. 12 and 13 are flowcharts illustrating examples of performing a read operation in FIG. 11.

Referring to FIGS. 11 and 12, when performing the read operation on all of the some wordlines on which the first program operation is performed under the same condition (operation S800), the memory cells connected to the first through X-th wordlines among the first through N-th wordlines may be sequentially read based on the read voltage having the same level (operation S810). Operation S810 in FIG. 12 may be applied or employed to the example where operations S100, S200, S300 and S400 in FIG. 11 are implemented as described with reference to FIGS. 4, 5A, 5B, 8A and 8B.

Referring to FIGS. 11 and 13, when performing the read operation on all of the some wordlines on which the first program operation is performed under the same condition (operation S800), the memory cells connected to the first through (Y−1)-th wordlines among the first through N-th wordlines, and the memory cells connected to the Y-th wordline among the first through N-th wordlines and connected to the first through Z-th string selection lines among the first through M-th string selection lines may be sequentially read based on the read voltage having the same level (operation S820). Operation S820 in FIG. 13 may be applied or employed to the example where operations S100, S200, S300 and S400 in FIG. 11 are implemented as described with reference to FIGS. 9, 10A and 10B.

As will be appreciated by those skilled in the art, the inventive concepts may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The control circuit 160, the memory controller 600, and any other elements disclosed may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 14:
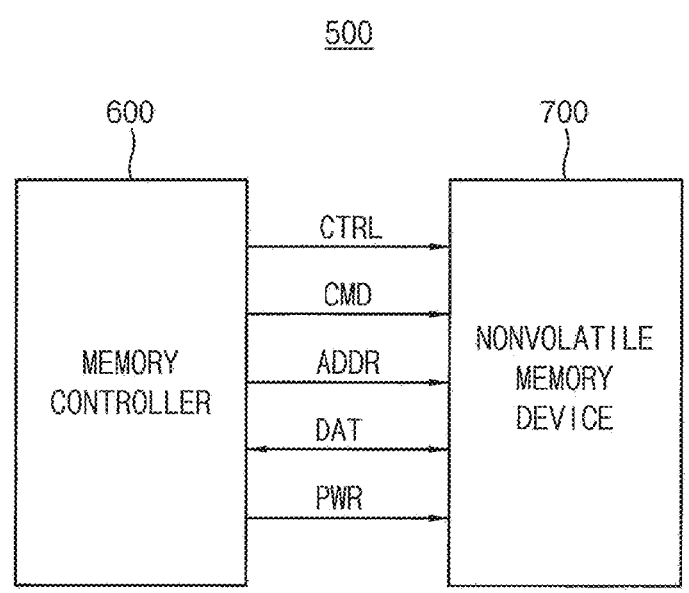
FIG. 14 is a block diagram illustrating a memory system according to example embodiments.

FIG. 14 is a block diagram illustrating a memory system according to example embodiments.

Referring to FIG. 14, a memory system 500 includes a memory controller 600 and at least one nonvolatile memory device 700.

The nonvolatile memory device 700 may correspond to the nonvolatile memory device according to example embodiments, may perform the method of operating the nonvolatile memory device according to example embodiments, and may perform data erase, program (or write) and/or read operations under control of the memory controller 600. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 15:
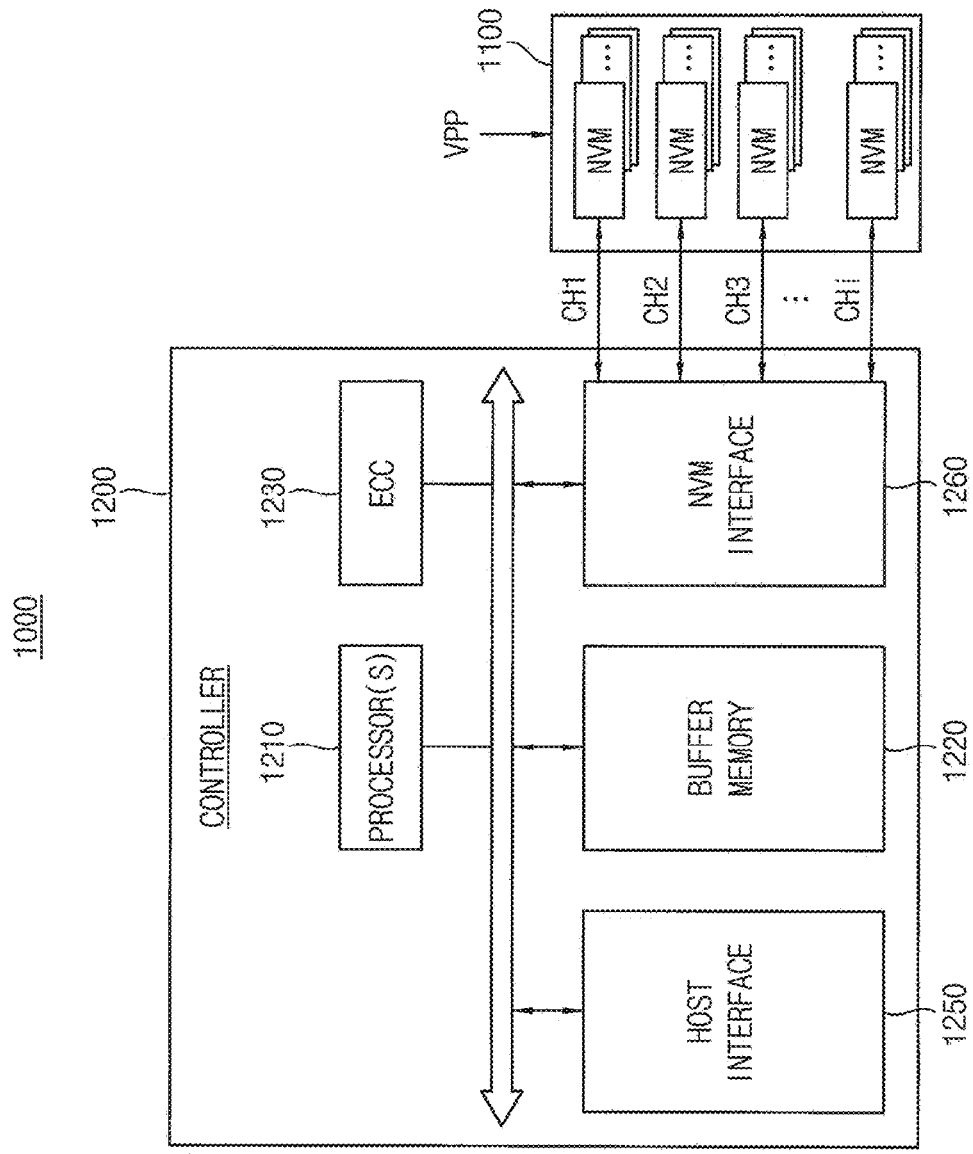
FIG. 15 is a block diagram illustrating a storage device that includes a nonvolatile memory device according to example embodiments.

FIG. 15 is a block diagram illustrating a storage device that includes a nonvolatile memory device according to example embodiments.

Referring to FIG. 15, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3, . . . , CHl. The controller 1200 may include one or more processors 1210, a buffer memory 1220, an error correction code (ECC) circuit 1230, a host interface 1250 and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments, and may be optionally supplied with an external high voltage VPP.

The inventive concepts may be applied to various electronic devices and electronic systems including the nonvolatile memory device. For example, the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a memory system including a memory controller and a nonvolatile memory device controlled by the memory controller, the nonvolatile memory device including a memory block that includes a plurality of memory cells and is connected to a plurality of wordlines, the method comprising:
performing a first program operation on some wordlines among the plurality of wordlines connected to the memory block, based on a host command received from an outside; and
performing a second program operation on an open wordline on which the first program operation is not performed and adjacent to a no-coupled wordline, regardless of the host command, the no-coupled wordline being at least one of the some wordlines on which the first program operation is performed.

2. The method of claim 1, wherein the plurality of wordlines include a first wordline through an N-th wordline, where N is a natural number greater than or equal to two, and
wherein performing the first program operation includes sequentially programming memory cells connected to the first wordline through an X-th wordline among the first through N-th wordlines, where X is a natural number greater than or equal to one and less than or equal to (N−1).

3. The method of claim 2, wherein the programmed X-th wordline among the programmed first through X-th wordlines is selected as the no-coupled wordline, the programmed X-th wordline is a last programmed wordline.

4. The method of claim 2, wherein performing the second program operation includes:
programming memory cells connected to an (X+1)-th wordline adjacent to the X-th wordline.

5. The method of claim 1, wherein performing the second program operation includes:

storing a last program time that is a time point at which the first program operation is terminated;

storing a current time;

comparing a first time with a predetermined threshold time, the first time being a time difference between the current time and the last program time; and in response to the first time being longer than the threshold time, programming memory cells connected to the open wordline on which the first program operation is not performed and adjacent to the no-coupled wordline.

6. The method of claim 1, wherein performing the second program operation includes:

determining whether a program failure occurs while the first program operation is performed; and in response to the program failure occurring, programming memory cells connected to the open wordline on which the first program operation is not performed and adjacent to the no-coupled wordline.

7. The method of claim 1, wherein the second program operation is a dummy program operation for programming dummy data in memory cells connected to the open wordline.

8. The method of claim 7, wherein, after the second program operation is performed, the no-coupled wordline is changed into a coupled wordline.

9. The method of claim 7, wherein the dummy data includes a random pattern.

10. The method of claim 1, wherein the plurality of wordlines include a first wordline through an N-th wordline, where N is a natural number greater than or equal to two, wherein the memory block is connected to a first string selection line through an M-th string selection line, where M is a natural number greater than or equal to two, and wherein performing the first program operation includes sequentially programming memory cells connected to the first wordline through a (Y−1)-th wordline among the first through N-th wordlines, and memory cells connected to a Y-th wordline among the first through N-th wordlines and the first string selection line through a Z-th string selection line among the first through M-th string selection lines, where Y is a natural number greater than or equal to two and less than or equal to (N−1), and Z is a natural number greater than or equal to one and less than or equal to (M−1).

11. The method of claim 10, wherein the programmed (Y−1)-th and Y-th wordlines among the programmed first through Y-th wordlines are selected as the no-coupled wordline, the programmed (Y−1)-th and Y-th wordlines are last programmed wordlines.

12. The method of claim 10, wherein performing the second program operation includes:

programming memory cells connected to the Y-th wordline and a (Z+1)-th string selection line through the M-th string selection line, and memory cells connected to a (Y+1)-th wordline adjacent to the Y-th wordline and the first string selection line through the Z-th string selection line.

13. The method of claim 10, wherein the memory block is included in a three-dimensional memory cell array in which the plurality of memory cells are stacked in a direction intersecting a substrate.

14. The method of claim 1, further comprising:

performing a read operation on all of the some wordlines on which the first program operation is performed under a same condition, based on a data read command transmitted from the memory controller to the nonvolatile memory device.

15. The method of claim 14, wherein performing the read operation includes:

sequentially reading memory cells connected to the some wordlines based on a read voltage having a same level.

16. The method of claim 1, wherein the second program operation is performed while the nonvolatile memory device is powered off.

17. The method of claim 16, wherein a case in which the nonvolatile memory device is powered off includes a sudden power off (SPO) case in which a power of the nonvolatile memory device is suddenly turned off, and a normal power off (NPO) case in which the power of the nonvolatile memory device is turned off according to a predetermined procedure.

18. The method of claim 1, wherein the second program operation is performed while the nonvolatile memory device is powered on and a power of the nonvolatile memory device is maintained.

19. The method of claim 1, wherein the host command is received from an external host device located outside the memory system.

20. A memory system comprising:

a memory controller; and a nonvolatile memory device controlled by the memory controller, wherein the nonvolatile memory device includes, a memory block including a plurality of memory cells and connected to a plurality of wordlines, and a control circuit configured to, perform a first program operation on some wordlines among the plurality of wordlines connected to the memory block, based on a host command received from an outside and a data write command transmitted from the memory controller to the nonvolatile memory device, and perform a second program operation on an open wordline on which the first program operation is not performed and adjacent to a no-coupled wordline, regardless of the host command, the no-coupled wordline being at least one of the some wordlines on which the first program operation is performed.

\* \* \* \* \*